(12) United States Patent
Tu et al.

(10) Patent No.: US 10,231,345 B2
(45) Date of Patent: Mar. 12, 2019

(54) ATTACHMENT APPARATUS AND ATTACHMENT METHOD FOR CONDUCTIVE ADHESIVE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Hanwei Tu, Beijing (CN); Minghui Liu, Beijing (CN); Hongjie Ding, Beijing (CN); Xikui Hao, Beijing (CN); Pengcheng Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/555,201

(22) PCT Filed: Mar. 6, 2017

(86) PCT No.: PCT/CN2017/075755
§ 371 (c)(1),
(2) Date: Sep. 1, 2017

(87) PCT Pub. No.: WO2017/202103
PCT Pub. Date: Nov. 30, 2017

(65) Prior Publication Data
US 2018/0110132 A1    Apr. 19, 2018

(30) Foreign Application Priority Data
May 26, 2016 (CN) .................... 2016 2 0514485 U (51) Int. Cl.
*H05K 3/30* (2006.01)
*H05K 3/36* (2006.01)
(Continued)

(52) U.S. Cl.
CPC ............. *H05K 3/361* (2013.01); *B32B 37/10* (2013.01); *G02F 1/1345* (2013.01); *H05B 33/10* (2013.01); *H05K 3/323* (2013.01); *Y10T 29/4913* (2015.01)

(58) Field of Classification Search
CPC ........ H05K 3/361; H05K 3/323; H05B 33/10; B32B 37/10; B29C 65/18; G02F 1/1345;
(Continued)

(56) References Cited

U.S. PATENT DOCUMENTS

| 6,336,990 B1 * | 1/2002 | Tanaka .................... B29C 65/18 29/830 |
| 2005/0183884 A1 | 8/2005 | Su |
| 2007/0084566 A1 * | 4/2007 | Seki ........................ B29C 65/18 156/583.1 |

FOREIGN PATENT DOCUMENTS

| CN | 101398540 A | 4/2009 |
| CN | 202225528 U | 5/2012 |
| CN | 205793713 U | 12/2016 |

OTHER PUBLICATIONS

International Search Report dated Jun. 12, 2017 corresponding to application No. PCT/CN2017/075755.

* cited by examiner

*Primary Examiner* — Donghai D Nguyen
(74) *Attorney, Agent, or Firm* — Nath, Goldberg & Meyer; Joshua B. Goldberg (57) ABSTRACT

Embodiments of the present invention provide an attachment apparatus and an attachment method for a conductive adhesive. The attachment apparatus includes: a carrier stage, (Continued)

which is provided with at least one working surface, the working surface being configured to support a printed circuit board and provided with a groove, and the groove being provided with a plurality of adsorption holes on its bottom surface; a vacuum adsorption device being connected to each of the plurality of adsorption holes; and an attaching mechanism provided above the carrier stage, and configured to attach the conductive adhesive to a predetermined region of the printed circuit board, and the predetermined region being a region of the printed circuit board to be squeeze connected to a flexible printed circuit board or a chip on film.

2 Claims, 2 Drawing Sheets

(51) Int. Cl.
  *B32B 37/10*   (2006.01)
  *G02F 1/1345*   (2006.01)
  *H05B 33/10*   (2006.01)
  *H05K 3/32*   (2006.01)

(58) Field of Classification Search
  CPC ......... Y10T 29/49126; Y10T 29/49128; Y10T 29/4913; Y10T 29/49144
  USPC .................. 29/830–832, 840; 156/583.1
  See application file for complete search history.

ATTACHMENT APPARATUS AND ATTACHMENT METHOD FOR CONDUCTIVE ADHESIVE

This is a National Phase Application filed under 35 U.S.C. 371 as a national stage of PCT/CN2017/075755, filed Mar. 6, 2017, an application claiming the benefit of Chinese Application No. 201620514485.0, filed May 26, 2016, the content of each of which is hereby incorporated by reference in its entirety.

TECHNICAL FIELD

Embodiments of the present invention relate to the field of display device machining technology, and in particular, relate to an attachment apparatus and an attachment method for a conductive adhesive.

BACKGROUND

In a case where a conductive adhesive is attached to electrode regions at both ends of a flexible printed circuit (FPC) board or a chip on film (COF), respectively, next, the conductive adhesive in one of the electrode regions of the FPC board or the COF is squeeze connected to a glass substrate by a high temperature squeeze connector, and finally, the conductive adhesive in the other of the electrode regions of the FPC board or the COF is squeeze connected to a printed circuit board by the high temperature squeeze connector, during the conductive adhesive in said one of the electrode regions being squeeze connected to the glass substrate, the heat radiated from the high temperature squeeze connector will cure the conductive adhesive in said other of the electrode regions in advance, resulting in poor squeeze connection. As a result, a large number of squeeze connected products which need to be replaced or repaired occur. Further, the FPC board or the COF is discarded as useless due to the conductive adhesive in said other of the electrode regions being cured in advance, thus the manufacturing cost is increased.

SUMMARY

To solve at least one of the technical problems existing in the prior art, embodiments of the present invention are to provide an attachment apparatus and an attachment method for a conductive adhesive, which can not only prevent the conductive adhesive from being cured in advance, but also increase the recycling rates of a flexible printed circuit board and a chip on film, thereby decreasing the manufacturing cost.

Embodiments of the present invention provide an attachment apparatus for a conductive adhesive, which includes: a carrier stage, which is provided with at least one working surface, the working surface being configured to support a printed circuit board and provided with a groove; and the groove being provided with a plurality of adsorption holes on its bottom surface; a vacuum adsorption device being connected to each of the plurality of adsorption holes; and an attaching mechanism provided above the carrier stage, and configured to attach the conductive adhesive to a predetermined region of the printed circuit board, and the predetermined region being a region of the printed circuit board to be squeeze connected to a flexible printed circuit board or a chip on film.

In an embodiment, a rubber block is provided on the bottom surface of the groove at a region other than the plurality of adsorption holes.

In an embodiment, the working surface is a top surface of the carrier stage.

In an embodiment, the vacuum adsorption device is a vacuum pump.

In an embodiment, the attachment apparatus for a conductive adhesive further includes: a first drive mechanism configured to drive the carrier stage to move in a first direction in a plane parallel to the working surface; and a second drive mechanism configured to drive the carrier stage to move in a second direction in the plane parallel to the working surface, wherein the second direction is perpendicular to the first direction.

In an embodiment, the first drive mechanism is a servo motor for movement along an X axis; and the second drive mechanism is a servo motor for movement along a Y axis, wherein the X axis is parallel to the first direction, and the Y axis is parallel to the second direction.

In an embodiment, the conductive adhesive includes a release film. The attaching mechanism includes: a feeding device configured to deliver the conductive adhesive, in a direction parallel to the carrier stage, to an upside of the carrier stage; a semi-cutter configured to die cut the conductive adhesive, so that the conductive adhesive forms a to-be-attached segment having a predetermined length; a pushing broach configured to attach the to-be-attached segment to the predetermined region of the printed circuit board; a separation rod configured to separate the release film on the to-be-attached segment from the to-be-attached segment; and a recycling device configured to recycle the release film separated from the to-be-attached segment.

As another technical solution, embodiments of the present invention provide an attachment method for a conductive adhesive. The attachment method includes steps of:

placing a printed circuit board on a carrier stage, which is provided with at least one working surface, the working surface is configured to support the printed circuit board and provided with a groove, and the groove is provided with a plurality of adsorption holes on its bottom surface;

adsorbing the printed circuit board on the working surface of the carrier stage through the adsorption holes; and attaching the conductive adhesive to a predetermined region of the printed circuit board, wherein the predetermined region is a region of the printed circuit board to be squeeze connected to a flexible printed circuit board or a chip on film.

In an embodiment, the attachment method further includes a step of:

prior to the step of placing a printed circuit board on a carrier stage, providing a rubber block on the bottom surface of the groove at a region other than the plurality of adsorption holes.

In an embodiment, the attachment method further includes steps of:

driving the carrier stage to move in a first direction in a plane parallel to the working surface; and driving the carrier stage to move in a second direction in the plane parallel to the working surface, wherein the second direction is perpendicular to the first direction.

In an embodiment of the attachment method, the conductive adhesive includes a release film. The attachment method further includes steps of:

prior to the step of attaching the conductive adhesive to a predetermined region of the printed circuit board, delivering the conductive adhesive, in a direction parallel to the carrier stage, to an upside of the carrier stage;

die cutting the conductive adhesive, so that the conductive adhesive forms a to-be-attached segment having a predetermined length; and attaching the to-be-attached segment to the predetermined region of the printed circuit board;

after the step of attaching the conductive adhesive to a predetermined region of the printed circuit board, separating the release film on the to-be-attached segment from the to-be-attached segment; and recycling the release film separated from the to-be-attached segment.

As still another technical solution, embodiments of the present invention provide an attachment method for a conductive adhesive implemented by the attachment apparatus for a conductive adhesive provided by embodiments of the present invention. The attachment method includes steps of:

placing a printed circuit board on the carrier stage, which is provided with at least one working surface, the working surface is configured to support the printed circuit board and provided with a groove, and the groove is provided with a plurality of adsorption holes on its bottom surface;

adsorbing the printed circuit board on the working surface of the carrier stage by the vacuum adsorption device; and attaching the conductive adhesive to a predetermined region of the printed circuit board by the attaching mechanism, wherein the predetermined region is a region of the printed circuit board to be squeeze connected to a flexible printed circuit board or a chip on film.

In an embodiment, the attachment method further includes a step of:

prior to the step of placing a printed circuit board on the carrier stage, providing a rubber block on the bottom surface of the groove at a region other than the plurality of adsorption holes.

In an embodiment of the attachment method, the working surface is a top surface of the carrier stage.

In an embodiment of the attachment method, the vacuum adsorption device is a vacuum pump.

In an embodiment, the attachment method further includes steps of:

driving, by the first drive mechanism, the carrier stage to move in a first direction in a plane parallel to the working surface; and driving, by the second drive mechanism, the carrier stage to move in a second direction in the plane parallel to the working surface, wherein the second direction is perpendicular to the first direction.

In an embodiment of the attachment method, the first drive mechanism is a servo motor for movement along an X axis, and the second drive mechanism is a servo motor for movement along a Y axis, wherein the X axis is parallel to the first direction, and the Y axis is parallel to the second direction.

In an embodiment of the attachment method, the conductive adhesive includes a release film. The attachment method further includes steps of:

prior to the step of attaching the conductive adhesive to a predetermined region of the printed circuit board, delivering the conductive adhesive, in a direction parallel to the carrier stage, to an upside of the carrier stage by the feeding device;

die cutting the conductive adhesive by the semi-cutter, so that the conductive adhesive forms a to-be-attached segment having a predetermined length; and attaching the to-be-attached segment to the predetermined region of the printed circuit board by the pushing broach;

after the step of attaching the conductive adhesive to a predetermined region of the printed circuit board, separating the release film on the to-be-attached segment from the to-be-attached segment by the separation rod; and recycling, by the recycling device, the release film separated from the to-be-attached segment.

As yet another technical solution, embodiments of the present invention provide an attachment method for a conductive adhesive. The attachment method includes steps of:

attaching the conductive adhesive to one of electrode regions at two opposite ends of a flexible printed circuit board or a chip on film;

attaching the conductive adhesive to a predetermined region of a printed circuit board, wherein the predetermined region is a region of the printed circuit board to be squeeze connected to the flexible printed circuit board or the chip on film;

squeeze connecting the electrode region of the flexible printed circuit board or the chip on film that is attached with the conductive adhesive to a glass substrate; and squeeze connecting the electrode region of the flexible printed circuit board or the chip on film that is not attached with the conductive adhesive to the region of the printed circuit board that is attached with the conductive adhesive.

In an embodiment, the electrode region of the flexible printed circuit board or the chip on film that is attached with the conductive adhesive is squeeze connected to the glass substrate by using a high temperature squeeze connector; and the electrode region of the flexible printed circuit board or the chip on film that is not attached with the conductive adhesive is squeeze connected to the region of the printed circuit board that is attached with the conductive adhesive by using the high temperature squeeze connector.

The advantageous effects of the embodiments of the present invention are as follows.

In the attachment apparatus for a conductive adhesive according to the embodiments of the present invention, a printed circuit board is supported by the carrier stage, and the conductive adhesive is attached to a predetermined region of the printed circuit board by the attaching mechanism, wherein the predetermined region is a region of the printed circuit board to be squeeze connected to a flexible printed circuit board or a chip on film. In this way, it only requires to attach the conductive adhesive to the electrode region, which is to be squeeze connected to a glass substrate, of the flexible printed circuit board or the chip on film. That is, one electrode region of the flexible printed circuit board or the chip on film is provided with the conductive adhesive, whereas another electrode region of the flexible printed circuit board or the chip on film is not provided with the conductive adhesive. Thus, during the process of squeeze connecting the flexible printed circuit board (or the chip on film) to the glass substrate, the problem that the conductive adhesive in said another electrode region is cured in advance will not occur, and therefore poor squeeze connection may be avoided. Further, when the flexible printed circuit board (or the chip on film) is squeeze connected to the printed circuit board subsequently, if poor squeeze connection occurs, it only needs to separate the flexible printed circuit board (or the chip on film) from the printed circuit board, remove the conductive adhesive remaining on the printed circuit board, attach the conductive adhesive to the printed circuit board again, and squeeze connect the flexible printed circuit board (or the chip on film) to the printed circuit board again. As a result, the recycling rates of the flexible printed circuit board and the chip on film is increased, thereby decreasing the manufacturing cost.

The attachment method for a conductive adhesive according to the embodiments of the present invention can not only prevent the conductive adhesive from being cured in advance; but also increase the recycling rates of a flexible printed circuit board and a chip on film; thereby decreasing the manufacturing cost.

DETAILED DESCRIPTION

For better understanding the technical solutions according to embodiments of the present invention by a person skilled in the art, an attachment apparatus and an attachment method for a conductive adhesive according to embodiments of the present invention will be further described in detail below with reference to the accompanying drawings.

The inventors of the present invention have found in research and practice that, an attachment method for a conductive adhesive such as anisotropic conductive film (ACF) may include steps of: firstly, the conductive adhesive is attached to electrode regions at both ends of a flexible printed circuit (FPC) board or a chip on film (COF), respectively; next, one of the electrode regions of the FPC board or the COF is squeeze connected to a glass substrate by the conductive adhesive in said one of the electrode regions; and finally, the other of the electrode regions of the FPC board or the COF is squeeze connected to a printed circuit board (PCB) by the conductive adhesive in said other of the electrode regions.

The attachment method for a conductive adhesive may have the following defects in a practical application.

On one hand, during said one of the electrode regions of the FPC board or the COF is squeeze connected to a glass substrate by the conductive adhesive in said one of the electrode regions, the heat radiated from a high temperature squeeze connector will cure the conductive adhesive in said other of the electrode regions in advance, causing poor squeeze connection to occur in the subsequent step that said other of the electrode regions of the FPC board or the COF is squeeze connected to a printed circuit board (PCB) by the conductive adhesive in said other of the electrode regions. As a result, a large number of squeeze connected products which need to be replaced or repaired occur.

On the other hand, if poor squeeze connection occurs when the FPC board or the COF is squeeze connected to the printed circuit board, the FPC board or the COF is discarded as useless and cannot be recycled since attachment of the conductive adhesive cannot be performed again after the FPC board or the COF is squeeze connected to the printed circuit board, thereby increasing the manufacturing cost.

In view of the above defects, the inventors of the present invention provide an improved attachment apparatus and an improved attachment method for a conductive adhesive, which will be described in detail below.

Figure 1:
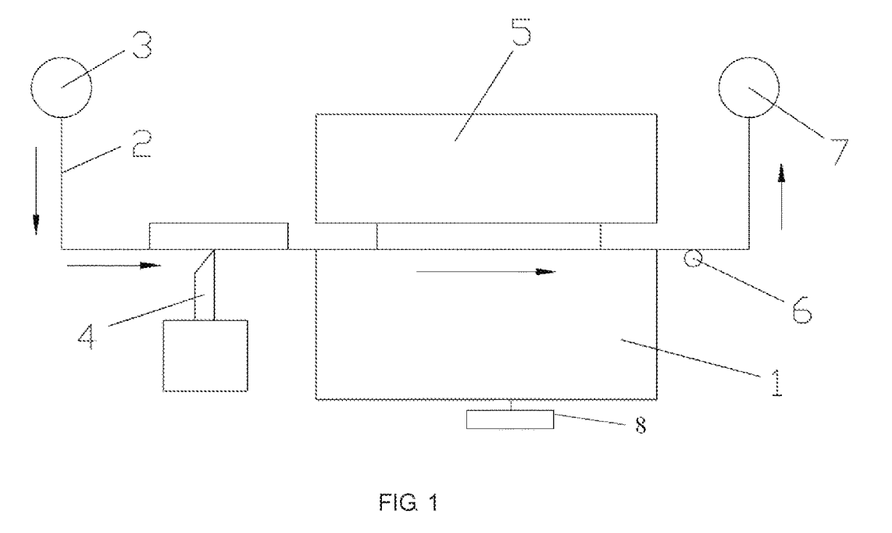
FIG. 1 is a diagram schematically showing a structure of an attachment apparatus for a conductive adhesive according to an embodiment of the present invention.
Figure 2:
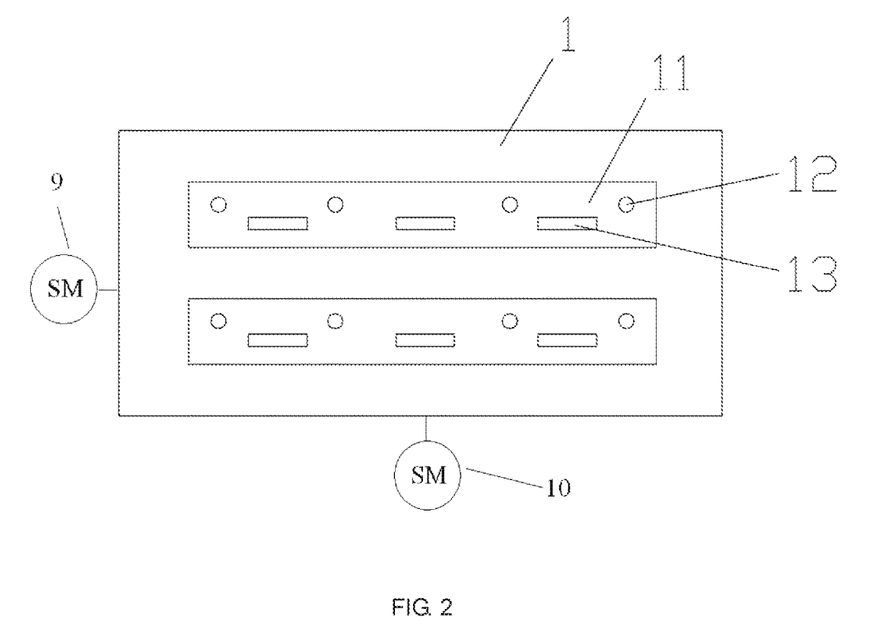
FIG. 2 is a top view schematically showing a carrier stage shown in FIG. 1.
Figure 3:
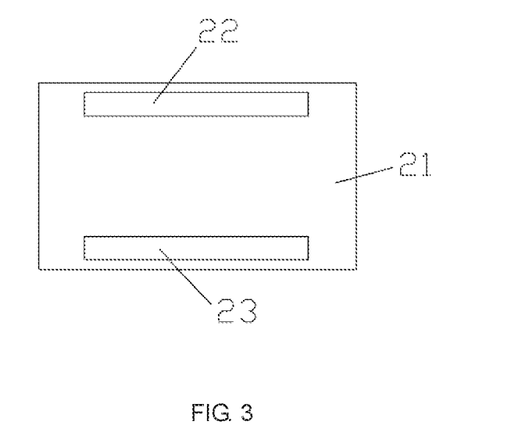
FIG. 3 is a top view schematically showing a flexible printed circuit board or a chip on film.
Figure 4:
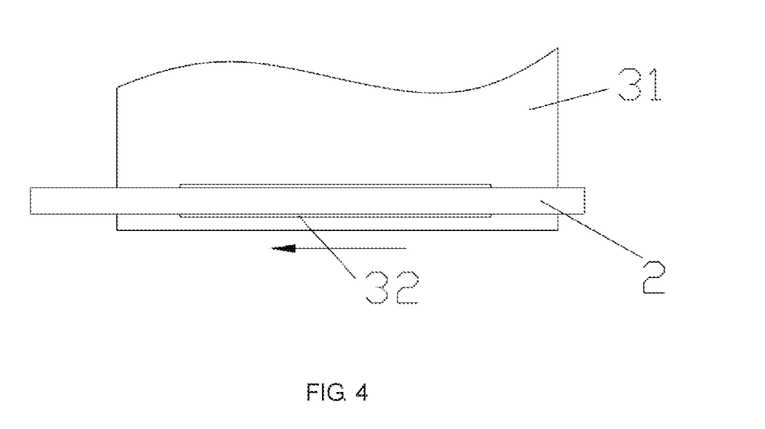
FIG. 4 is a top view schematically showing a printed circuit board when a conductive adhesive is attached to the printed circuit board.

Referring to FIGS. 1 to 5, two electrode regions 22 and 23 are provided opposite to each other at the peripheral of a flexible printed circuit board (or a chip on film) 21, and the two electrode regions 22 and 23 may be at two opposite ends of the flexible printed circuit board (or the chip on film) 21, wherein one electrode region is to be squeeze connected to a glass substrate, and the other electrode region is to be squeeze connected to a printed circuit board 31, as shown in FIGS. 3 and 4.

The attachment apparatus for a conductive adhesive 2 according to an embodiment of the present invention may be used to attach the conductive adhesive 2 to a region 32 of the printed circuit board 31, and the region 32 may be a region of the printed circuit board 31 to be squeeze connected to the flexible printed circuit board 21, as shown in FIG. 4. An existing attachment method for the conductive adhesive 2 may be improved by using the attachment apparatus. Specifically, the conductive adhesive 2 is attached to the electrode region of the flexible printed circuit board 21 that is to be squeeze connected to the glass substrate, but is not attached to the electrode region of the flexible printed circuit board 21 that is to be squeeze connected to the printed circuit board 31. Further, the conductive adhesive 2 may be attached to the region 32 of the printed circuit board 31 that is to be squeeze connected to the flexible printed circuit board 21, by using the attachment apparatus for the conductive adhesive 2 according to an embodiment of the present invention. Then, the flexible printed circuit board 21 may be squeeze connected to the printed circuit board 31. In this case, the electrode region of the flexible printed circuit board 21 that is to be squeeze connected to the printed circuit board 31 and the region 32 of the printed circuit board 31 is bonded to each other, and electric conduction therebetween is achieved.

Since one electrode region of the flexible printed circuit board 21 is provided with the conductive adhesive 2, whereas another electrode region thereof is not provided with the conductive adhesive 2, during the process of squeeze connecting the flexible printed circuit board 21 to the glass substrate through said one electrode region provided with the conductive adhesive 2, the problem that the conductive adhesive in said another electrode region is cured in advance will not occur, and therefore poor squeeze connection may be avoided. Further, when the flexible printed circuit board 21 is squeeze connected to the printed circuit board 31 subsequently, if poor squeeze connection occurs, it only needs to separate the flexible printed circuit board 21 from the printed circuit board 31, remove the conductive adhesive 2 remaining on the printed circuit board 31, attach the conductive adhesive 2 to the printed circuit board 31 again, and squeeze connect the flexible printed circuit board 21 to the printed circuit board 31 again. As a result, the recycling rate of the flexible printed circuit board 21 is increased, thereby decreasing the manufacturing cost.

In the above description, a case where the conductive adhesive 2 is attached to a region, which is to be squeeze connected to the flexible printed circuit board 21, of the printed circuit board 31, by using the attachment apparatus for the conductive adhesive 2 according to an embodiment of the present invention is taken as an example, but an embodiment of the present invention is not limited thereto. For the chip on film 21, the conductive adhesive 2 may also be attached to a region, which is to be squeeze connected to the chip on film 21, of the printed circuit board 31, by using the attachment apparatus for the conductive adhesive 2 according to an embodiment of the present invention, and the specific attachment method and process thereof are the same as those described above and detailed description thereof is thus omitted herein. Further, for the chip on film 21, since it does not need to attach the conductive adhesive 2 to the electrode region of the chip on film 21 that is to be squeeze connected to the printed circuit board 31, the steps of die cutting the chip on film 21 and attaching the conductive adhesive 2 by manual feeding may be omitted. The omission of these steps enables automatic feeding of the chip on film 21. As a result, not only the efficiency of a rework system may be increased and thus the production capacity may be increased, but also defects such as pollution, degradation of product quality, and the like due to manual feeding for attaching the conductive adhesive 2 may be avoided.

A structure of the attachment apparatus for the conductive adhesive 2 according to an embodiment of the present invention will be described in detail below. Specifically, the attachment apparatus include a carrier stage 1 and an attaching mechanism. The attaching mechanism will be described later, and the carrier stage 1 is described first. At least one working surface configured to support the printed circuit board 31 is provided on the carrier stage 1, and the working surface may be a top surface of the carrier stage 1 (that is, the reference numeral 1 denotes not only the carrier stage but also the working surface of the carrier stage, as shown in FIG. 2). Optionally, as shown in FIG. 2, the carrier stage 1 is provided with a plurality of grooves 11 on the working surface, and each of the grooves 11 is provided with a plurality of adsorption holes 12 on its bottom surface. FIG. 2 shows that each of the grooves 11 is provided with four circular adsorption holes 12 on its bottom surface. However, the number, shape, and distribution manner of the adsorption holes 12 are not limited to those shown in FIG. 2, and may be any other suitable ones. Each of the grooves 11 may be provided with one printed circuit board 31 therein.

The attachment apparatus may further include a vacuum adsorption device 8, which is connected to each of the plurality of adsorption holes 12, and is configured to extract the air between the bottom surface of the printed circuit board 31 and bottom surface of each of the grooves 11 via the adsorption holes 12, so that the printed circuit board 31 is vacuum adsorbed, and it is ensured that the printed circuit board 31 is fixed to the carrier stage 1 without movement when the conductive adhesive 2 is attached thereto. For example, the vacuum adsorption device may be a vacuum pump.

Further optionally, a plurality of rubber blocks may be provided on the bottom surface of each of the grooves 11 at regions other than the plurality of adsorption holes 12, for increasing the degree of fitting between the printed circuit board 31 and the working surface of the carrier stage 1. FIG. 2 shows that three rectangular rubber blocks are provided on the bottom surface of each of the grooves 11 at regions other than the plurality of adsorption holes 12. However, the number, shape, and distribution manner of the rubber block 13 are not limited to those shown in FIG. 2, and may be any other suitable ones.

Further optionally, to achieve precise alignment of the carrier stage 1, the attachment apparatus may further include a first drive mechanism 9 and a second drive mechanism 10. The first drive mechanism 9 is configured to drive the carrier stage 1 to move in a first direction (e.g., the horizontal direction in FIG. 2) in a plane parallel to the working surface, and the second drive mechanism 10 is configured to drive the carrier stage 1 to move in a second direction (e.g., the vertical direction in FIG. 2) in the plane parallel to the working surface, wherein the second direction is perpendicular to the first direction. In this way, a coordinate system may be established in a plane in which the working surface located, wherein the above first and second directions are represented by an X axis and a Y axis, respectively. Thus, positions of each printed circuit board 31 on the working surface may be represented by coordinates, and automatic control of the first drive mechanism 9 and/or the second drive mechanism 10 to drive the carrier stage 1 to move may be achieved by programming, thereby achieving precise alignment of the carrier stage 1. In other words, the X axis may be parallel to a delivery direction of the conductive adhesive, and the Y axis may be perpendicular to the delivery direction of the conductive adhesive. Specific structures of the first drive mechanism and the second drive mechanism are not limited in embodiments of the present invention, as long as the first drive mechanism and the second drive mechanism can drive the carrier stage to move. For example, the first drive mechanism 9 may be a servo motor for movement along the X axis, and the second drive mechanism 10 may be a servo motor for movement along the Y axis.

Next, the attaching mechanism will be described below. The attaching mechanism is provided above (or around) the carrier stage 1, and is configured to attach the conductive adhesive 2 to a predetermined region of the printed circuit board 31. The predetermined region is a region of the printed circuit board 31 to be squeeze connected to the flexible printed circuit board (or the chip on film) 21, i.e., the region 32, which is to be squeeze connected to the flexible printed circuit board (or the chip on film) 21, of the printed circuit board 31, as shown in FIG. 4.

Figure 5:
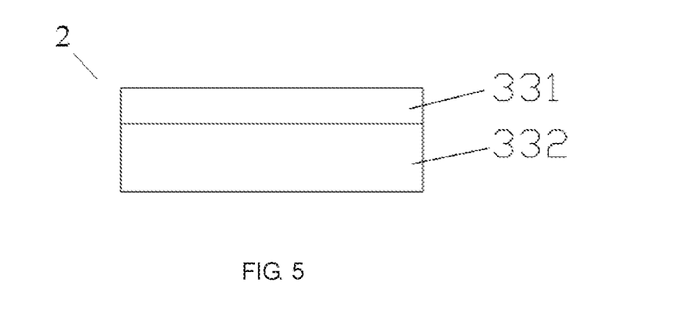
FIG. 5 is a side view schematically showing a conductive adhesive.

As shown in FIG. 5, for ease of packaging (e.g., packaging in a form of reel), the conductive adhesive 2 may include an adhesive layer 332 and a release film 331 which is a carrier. Based on this, optionally, the attaching mechanism performs attachment of the conductive adhesive 2 in a manner of automatic feeding. Specifically, as shown in FIG. 1, the attaching mechanism includes a feeding device 3, a semi-cutter 4, a pushing broach 5, a separation rod 6, and a recycling device 7. Herein, the feeding device 3 is configured to deliver the conductive adhesive 2, in a direction parallel to the carrier stage 1 (i.e., the direction indicated by the horizontal arrows as shown in FIG. 1), to an upside of the working surface of the carrier stage 1. The semi-cutter 4 is configured to die cut the adhesive layer 332 of the conductive adhesive 2, so that the adhesive layer 332 forms a to-be-attached segment having a predetermined length; whereas the release film 331 of the conductive adhesive 2 is not cut off, which can be achieved by controlling a die-cutting distance of the semi-cutter 4. The die-cutting distance meets the requirement that a cutting blade of the semi-cutter 4 only cuts off the adhesive layer 332 of the conductive adhesive 2 when the semi-cutter 4 vertically moves to the upmost position relative to the carrier stage 1. As shown in FIG. 4, it may be assumed that if the conductive adhesive 2 moves in a direction indicated by the arrow as shown in FIG. 4 (leftwards) relative to the printed circuit board 31, when the conductive adhesive 2 passes through the semi-cutter 4, the adhesive layer 332 of the conductive adhesive 2 is die cut to form to-be-attached segments. Each of the to-be-attached segments has a length which meets the requirement for attachment to the region 32 of the printed circuit board 31. At this time, each of the to-be-attached segments keeps being attached to the release film 331, and the release film 331 is always in a shape of continuous band.

The pushing broach 5 is configured to attach the to-be-attached segment, which is die cut by the semi-cutter 4, to the predetermined region 32 of the printed circuit board 31. The separation rod 6 is configured to separate the release film on the current to-be-attached segment from the current to-be-attached segment. At this time, the adhesive layer 332 of the current to-be-attached segment is attached to the predetermined region 32, whereas the release film 331 is separated from the adhesive layer 332 of the current to-be-attached segment and continues to move forwards. The recycling device 7 is configured to recycle the release film 331 separated from the to-be-attached segment. In this way, a whole attachment process of the conductive adhesive 2 is finished.

To sum up, automatic attachment of the conductive adhesive 2 may be achieved by the combination of automatic alignment of the carrier stage 1 and automatic delivery of the attaching mechanism. During the automatic attachment, except manual picking-up and placement of the printed circuit board 31, the remaining actions may be automatically performed by the attachment apparatus. Thus, the attachment apparatus may have a high efficiency, and thus the production capacity is increased.

As another technical solution, embodiments of the present invention further provide a rework system. The rework system includes a first attachment apparatus for the conductive adhesive 2, and the first attachment apparatus may be the above attachment apparatus for the conductive adhesive 2 according to the embodiments of the present invention.

Optionally, the rework system may further include a second attachment apparatus for the conductive adhesive 2. The second attachment apparatus is configured to attach the conductive adhesive 2 to a predetermined region of the flexible printed circuit board (or the chip on film) 21, and the predetermined region is an electrode region of the flexible printed circuit board (or the chip on film) 21 that is to squeeze connected to the glass substrate. The second attachment apparatus may be the above attachment apparatus for the conductive adhesive 2 according to the embodiments of the present invention, or an attachment apparatus in the prior art.

Optionally, the rework system may further include a squeeze connecting apparatus for the flexible printed circuit board (or the chip on film) 21. The squeeze connecting apparatus is configured to squeeze connect the flexible printed circuit board (or the chip on film) 21 that is attached with the conductive adhesive 2 to the printed circuit board 31 of which the predetermined region 32 is attached with the conductive adhesive 2. Optionally, the rework system may further include a third attachment apparatus for the conductive adhesive 2. The third attachment apparatus is configured to attach the conductive adhesive 2 to a predetermined region of the chip on film, and the predetermined region is an electrode region of the chip on film that is configured to squeeze connect the chip on film to the glass substrate. The third attachment apparatus may be the above attachment apparatus for the conductive adhesive 2 according to the embodiments of the present invention, or an attachment apparatus in the prior art.

Optionally, the rework system may further include a squeeze connecting apparatus for the chip on film. This squeeze connecting apparatus is configured to squeeze connect the chip on film attached with the conductive adhesive 2 to the printed circuit board 31 of which the predetermined region 32 is attached with the conductive adhesive 2.

By employing the attachment apparatus for the conductive adhesive 2 according to the embodiment of the present invention, the rework system provided by the embodiment of the present invention can not only prevent the conductive adhesive from being cured in advance, but also increase the recycling rates of the flexible printed circuit board and the chip on film, thereby decreasing the manufacturing cost.

As another technical solution, embodiments of the present invention further provide an attachment method for the conductive adhesive. The attachment method may be performed manually, or may be implemented by a suitable device. The attachment method includes steps of:

placing a printed circuit board 31 on a carrier stage 1, which is provided with at least one working surface, the working surface is configured to support the printed circuit board 31 and provided with a groove 11, and the groove 11 is provided with a plurality of adsorption holes 12 on its bottom surface;

adsorbing the printed circuit board 31 on the working surface of the carrier stage 1 through the adsorption holes; and attaching the conductive adhesive 2 to a predetermined region 32 of the printed circuit board 31, wherein the predetermined region 32 is a region of the printed circuit board 31 to be squeeze connected to a flexible printed circuit board (or a chip on film) 21.

In an embodiment, the attachment method may further include a step of:

prior to the step of placing a printed circuit board 31 on a carrier stage 1, providing a rubber block 13 on the bottom surface of the groove 11 at a region other than the plurality of adsorption holes 12.

In an embodiment, the attachment method may further include steps of:

driving the carrier stage 1 to move in a first direction (e.g., the horizontal direction in FIG. 2) in a plane parallel to the working surface; and driving the carrier stage 1 to move in a second direction (e.g., the vertical direction in FIG. 2) in the plane parallel to the working surface, wherein the second direction is perpendicular to the first direction.

In an embodiment of the attachment method, the conductive adhesive 2 includes a release film. The attachment method may further include steps of:

prior to the step of attaching the conductive adhesive 2 to a predetermined region 32 of the printed circuit board 31, delivering the conductive adhesive 2, in a direction parallel to the carrier stage 1, to an upside of the carrier stage 1;

die cutting the conductive adhesive 2, so that the conductive adhesive 2 forms a to-be-attached segment having a predetermined length; and attaching the to-be-attached segment to the predetermined region 32 of the printed circuit board 31;

after the step of attaching the conductive adhesive 2 to a predetermined region 32 of the printed circuit board 31, separating the release film on the to-be-attached segment from the to-be-attached segment; and recycling the release film separated from the to-be-attached segment.

The attachment method for the conductive adhesive according to the embodiments of the present invention can not only prevent the conductive adhesive from being cured in advance, but also increase the recycling rates of a flexible printed circuit board and a chip on film, thereby decreasing the manufacturing cost.

As still another technical solution, embodiments of the present invention provide still another attachment method for a conductive adhesive implemented by the attachment apparatus for a conductive adhesive provided by the embodiments of the present invention. The attachment method may include steps of:

placing a printed circuit board 31 on the carrier stage 1, which is provided with at least one working surface, the working surface is configured to support the printed circuit board 31 and provided with a groove 11, and the groove 11 is provided with a plurality of adsorption holes 12 on its bottom surface;

adsorbing the printed circuit board 31 on the working surface of the carrier stage 1 by the vacuum adsorption device 8; and attaching the conductive adhesive 2 to a predetermined region 32 of the printed circuit board 31 by the attaching mechanism, wherein the predetermined region 32 is a region of the printed circuit board 31 to be squeeze connected to a flexible printed circuit board (or a chip on film) 21.

In an embodiment, the attachment method may further include a step of:

prior to the step of placing a printed circuit board 31 on the carrier stage 1, providing a rubber block 13 on the bottom surface of the groove 11 at a region other than the plurality of adsorption holes 12.

In an embodiment of the attachment method, the working surface may be a top surface of the carrier stage 1.

In an embodiment of the attachment method, the vacuum adsorption device 8 may be a vacuum pump.

In an embodiment, the attachment method may further include steps of:

driving, by the first drive mechanism 9, the carrier stage 1 to move in a first direction (e.g., the horizontal direction in FIG. 2) in a plane parallel to the working surface; and driving, by the second drive mechanism 10, the carrier stage 1 to move in a second direction (e.g.; the vertical direction in FIG. 2) in the plane parallel to the working surface, wherein the second direction is perpendicular to the first direction.

In an embodiment of the attachment method, the first drive mechanism 9 may be a servo motor for movement along an X axis, and the second drive mechanism 10 may be a servo motor for movement along a Y axis, wherein the X axis is parallel to the first direction, and the Y axis is parallel to the second direction.

In an embodiment of the attachment method, the conductive adhesive 2 includes a release film. The attachment method may further include steps of:

prior to the step of attaching the conductive adhesive 2 to a predetermined region 32 of the printed circuit board 31, delivering the conductive adhesive 2, in a direction parallel to the carrier stage 1, to an upside of the carrier stage 1 by the feeding device 3;

die cutting the conductive adhesive 2 by the semi-cutter 4, so that the conductive adhesive 2 forms a to-be-attached segment having a predetermined length; and attaching the to-be-attached segment to the predetermined region 32 of the printed circuit board 31 by the pushing broach 5;

after the step of attaching the conductive adhesive 2 to a predetermined region 32 of the printed circuit board 31, separating the release film on the to-be-attached segment from the to-be-attached segment by the separation rod 6; and recycling, by the recycling device 7, the release film separated from the to-be-attached segment.

By being implemented by the attachment apparatus for a conductive adhesive according to the embodiment of the present invention, the attachment method for a conductive adhesive provided by the embodiments of the present invention can not only prevent the conductive adhesive from being cured in advance, but also increase the recycling rates of the flexible printed circuit board and the chip on film, thereby decreasing the manufacturing cost.

As yet another technical solution, embodiments of the present invention provide yet another attachment method for a conductive adhesive. The attachment method may include steps of:

attaching the conductive adhesive 2 to one (e.g., electrode region 22) of two electrode regions 22 and 23 at two opposite ends of a flexible printed circuit board (or a chip on film) 21;

attaching the conductive adhesive 2 to a region 32, which is to be squeeze connected to the flexible printed circuit board (or the chip on film) 21, of a printed circuit board 31;

squeeze connecting the electrode region (e.g., the electrode region 22) of the flexible printed circuit board (or the chip on film) 21 that is attached with the conductive adhesive 2 to a glass substrate; and squeeze connecting the electrode region (e.g., the electrode region 23) of the flexible printed circuit board (or the chip on film) 21 that is not attached with the conductive adhesive 2 to the region 32 of the printed circuit board 31 that is attached with the conductive adhesive 2.

It should be noted that, the conductive adhesive 2 may not be attached to the electrode region 22, but is attached to the electrode region 23. Correspondingly, the electrode region 23 of the flexible printed circuit board (or the chip on film) 21 that is attached with the conductive adhesive 2 may be squeeze connected to a glass substrate, and the electrode region 22 of the flexible printed circuit board (or the chip on film) 21 that is not attached with the conductive adhesive 2 may be squeeze connected to the region 32 of the printed circuit board 31 that is attached with the conductive adhesive 2.

In an embodiment, the electrode region of the flexible printed circuit board (or the chip on film) 21 that is attached with the conductive adhesive 2 may be squeeze connected to the glass substrate by using a high temperature squeeze connector; and the electrode region of the flexible printed circuit board (or the chip on film) 21 that is not attached with the conductive adhesive 2 may be squeeze connected to the region 32 of the printed circuit board 31 that is attached with the conductive adhesive 2 by using the high temperature squeeze connector.

It should be understood that, the above embodiments are only exemplary embodiments for the purpose of explaining the principle of the present invention, and embodiments of the present invention are not limited thereto. For a person skilled in the art, various improvements and modifications may be made without departing from the spirit and essence of the present invention. These improvements and modifications also fall within the protection scope of the present invention.

What is claimed is:

1. An attachment method for a conductive adhesive, comprising the following steps performed in sequential order:

attaching the conductive adhesive to one of electrode regions at two opposite ends of a flexible printed circuit board or a chip on film;

attaching the conductive adhesive to a predetermined region of a printed circuit board, wherein the predetermined region is a region of the printed circuit board to be squeeze connected to the flexible printed circuit board or the chip on film;

squeeze connecting the electrode region of the flexible printed circuit board or the chip on film that is attached with the conductive adhesive to a glass substrate; and squeeze connecting the electrode region of the flexible printed circuit board or the chip on film that is not attached with the conductive adhesive to the region of the printed circuit board that is attached with the conductive adhesive, wherein the conductive adhesive attached to the flexible printed circuit board is the same as the conductive adhesive attached to the printed circuit board.

2. The attachment method according to claim 1, wherein the electrode region of the flexible printed circuit board or the chip on film that is attached with the conductive adhesive is squeeze connected to the glass substrate by using a high temperature squeeze connector; and the electrode region of the flexible printed circuit board or the chip on film that is not attached with the conductive adhesive is squeeze connected to the region of the printed circuit board that is attached with the conductive adhesive by using the high temperature squeeze connector.

* * * * *